United States Patent
Riley et al.

(10) Patent No.: US 6,492,275 B2
(45) Date of Patent: *Dec. 10, 2002

(54) CONTROL OF TRANSISTOR PERFORMANCE THROUGH ADJUSTMENT OF SPACER OXIDE PROFILE WITH A WET ETCH

(75) Inventors: Deborah J. Riley, Austin, TX (US); Terri A. Couteau, Rosanky, TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/488,870

(22) Filed: Jan. 21, 2000

(65) Prior Publication Data

US 2002/0119647 A1 Aug. 29, 2002

(51) Int. Cl.⁷ .............................................. H01L 21/311
(52) U.S. Cl. ........................................ 438/696; 438/303
(58) Field of Search .................................. 438/595, 694, 438/695, 696, 704, 706, 14, 17, 303, 305, 239, 396

(56) References Cited

U.S. PATENT DOCUMENTS

| | | | |
|---|---|---|---|
| 4,951,100 A | 8/1990 | Parrillo | 357/233 |
| 4,981,810 A | 1/1991 | Fazan et al. | 437/44 |
| 5,015,598 A | 5/1991 | Verhaar | 437/44 |
| 5,030,590 A | 7/1991 | Amini et al. | 438/704 |
| 5,064,774 A | * 11/1991 | Pfiester | 427/31 |

(List continued on next page.)

FOREIGN PATENT DOCUMENTS

| | | | |
|---|---|---|---|
| EP | 05160146 | 6/1993 | H01L/21/336 |
| WO | WO 00/01011 A | 1/2000 | H01L/21/8238 |

OTHER PUBLICATIONS

Stanley Wolf and Richard N. Tauber; *Silicon Processing for the VLSI Era*, vol. 2—*Process Integration*; pp. 307–314; 1990.

Stanley Wolf and Richard N. Tauber; *Silicon Processing for the VLSI Era*, col. 3—*The Submicron MOSFET*; pp. 596–5989; 1995.

M. Watanabe et al.; *Etching Rates of $SiO_2$ and $Si_3N_4$ Insulating Films in Ammonia Hydrogen–Peroxide Cleaning Process*; Electrochemical Society, Princeton, New Jersey, vol. 83, No. 1; pp. 221–222; May 1, 1983.

Stanley Wolf and Richard N. Tauber; *Silicon Processing for the VLSI Era*, vol. 1—*Process Technology*; pp. 516–517 and 529–530; 1986.

*Primary Examiner*—Caridad Everhart
*Assistant Examiner*—Calvin Lee
(74) *Attorney, Agent, or Firm*—Timothy M. Honeycut

(57) ABSTRACT

Methods of patterning sidewall spacers are provided. In one aspect, a method of fabricating a circuit device includes forming a gate on a substrate and forming a first oxide spacer and a second oxide spacer adjacent to the gate. The width of the gate and the first and second oxide spacers is measured. The widths of the first and second oxide spacers are trimmed if the width of the gate and the first and second oxide spacers exceeds a preselected maximum value by exposing the first and second oxide spacers to a solution of ammonium hydroxide, hydrogen peroxide and water for a preselected like and rinsing with deionized water. Spacer width may be finely tuned to reduce the risk of weak overlap and to improve device characteristics through shorter channels.

19 Claims, 3 Drawing Sheets

U.S. PATENT DOCUMENTS

| | | | | |
|---|---|---|---|---|
| 5,147,499 | A | 9/1992 | Szwejkowski et al. | 438/704 |
| 5,296,093 | A | 3/1994 | Szwejkowski et al. | 216/13 |
| 5,312,781 | A | 5/1994 | Gregor et al. | 437/235 |
| 5,413,678 | A | 5/1995 | Hossain | 156/657.1 |
| 5,431,770 | A | 7/1995 | Lee et al. | 438/704 |
| 5,460,993 | A * | 10/1995 | Hsu et al. | 437/44 |
| 5,614,428 | A | 3/1997 | Kapoor | 438/592 |
| 5,672,544 | A | 9/1997 | Pan | 437/200 |
| 5,739,573 | A | 4/1998 | Kawaguchi | 257/384 |
| 5,863,824 | A | 1/1999 | Gardner et al. | 438/303 |
| 5,920,783 | A | 7/1999 | Tseng et al. | 438/305 |
| 5,976,767 | A | 11/1999 | Li | 438/753 |
| 5,976,769 | A | 11/1999 | Chapman | 438/734 |
| 5,998,273 | A | 12/1999 | Ma et al. | 438/305 |
| 6,124,190 | A | 9/2000 | Yamamoto et al. | 438/592 |
| 6,127,212 | A * | 10/2000 | Chen et al. | 438/199 |
| 6,133,132 | A * | 10/2000 | Toprac et al. | 438/595 |
| 6,140,192 | A | 10/2000 | Huang et al. | 438/305 |
| 6,171,959 | B1 * | 1/2001 | Nagabushnam | 438/683 |
| 6,180,501 | B1 | 1/2001 | Pey et al. | 438/592 |
| 6,194,279 | B1 | 2/2001 | Chen et al. | 438/303 |
| 6,194,297 | B1 | 2/2001 | Cheng | 438/592 |
| 6,197,648 | B1 | 3/2001 | Kasai et al. | 438/305 |
| 6,230,720 | B1 * | 5/2001 | Yalamanchili et al. | 134/1.3 |
| 6,235,598 | B1 | 5/2001 | Jan et al. | 438/303 |
| 6,245,626 | B1 | 6/2001 | Chen et al. | 438/305 |

\* cited by examiner

CONTROL OF TRANSISTOR PERFORMANCE THROUGH ADJUSTMENT OF SPACER OXIDE PROFILE WITH A WET ETCH

BACKGROUND OF THE INVENTION

1. Field of the Invention

This invention relates generally to semiconductor processing, and more particularly to a method of patterning insulating sidewall spacers using a wet etch.

2. Description of the Related Art

One variant of a basic conventional field effect transistor consists of a gate electrode stack fabricated on a lightly doped semiconductor substrate. The gate electrode stack consists of a gate dielectric layer and a gate electrode. A source region and a drain region are formed in the substrate beneath the gate dielectric layer and separated laterally to define a channel region. The gate electrode is designed to emit an electric field into the channel region. Changes in the electric field emitted by the gate electrode enable, or alternatively, disable the flow of current between the source and the drain. In many processes, the source/drain regions consist of a lightly doped drain ("LDD") and an overlapping heavier doped region. The source/drain regions are electrically isolated laterally from adjacent conducting structures by isolation structures such as insulating trenches or field oxide regions.

The performance of field effect transistors is dramatically affected by drive current and channel transconductance. As a general rule, higher drive current and channel transconductance translate into more desirable device performance. Drive current may be enhanced by reducing the length of the channel, as drive current is inversely proportional to channel length. Both drive current and channel transconductance may be improved by reducing the resistance of the channel. Channel resistance may be reduced by decreasing doping level in the channel and by minimizing weak overlap conditions. Weak overlap occurs where the edges of the gate electrode and the drain are offset.

In a conventional process flow for forming a typical field effect transistor, a gate oxide layer is grown on a lightly doped silicon substrate and a conducting layer of aluminum or polysilicon is deposited on the gate oxide layer. The conducting layer is then anisotropically etched selectively to the gate oxide to define a gate electrode stacked on top of the gate oxide layer. Following formation of the gate electrode, a source and a drain are formed, usually by implanting a dopant species into the substrate. The gate electrode acts as a hard mask against the implant so that the source and drain are formed in the substrate self-aligned to the gate electrode. The substrate is then annealed to activate the dopant in the source and the drain. Salicidation steps frequently follow the formation of the source and drain.

In conventional processes incorporating LDD structures, a first set of oxide spacers is fabricated adjacent to the gate electrode prior to the LDD implant. The purpose of the first set of spacers is to provide a slight offset between the implanted substrate region and the gate edge so that damage to the edges of the gate electrode and the gate oxide layer and the substrate at the gate oxide edges is minimized. The first set of spacers is fabricated by forming a conformal layer of oxide over the gate electrode by chemical vapor deposition ("CVD") or thermal oxidation and performing a subsequent anisotropic etch to define the spacers. The deliberate offset between the LDD edges and the gate edges is subsequently reduced by annealing. The goal of the anneal is to both activate the LDD and to eliminate the weak overlap.

Many conventional processes have incorporated RCA cleaning processes following the plasma etch to define the spacers. Some of these RCA process have employed etch mixtures of ammonium hydroxide and peroxide. Some unintentional etching activity on oxide films has been observed.

Following the LDD implant, a second set of insulating spacers is formed in what is largely a repeat of the earlier process used to fabricate the first set of spacers. The second set of spacers mask the substrate so that the second source/drain implant establishes overlapping heavier doped regions with an offset from the gate edges. In addition, the second set of spacers inhibit hot carrier injection from the later-formed silicide films on the substrate.

There are disadvantages associated with conventional techniques for patterning spacers. First, there is the potential for non-optimal device performance due to weak overlap. Both the first and second sets of spacers are fabricated so that the width of each spacer falls within a specified range. Subsequent anneals to activate the source/drain regions are then tailored in view of the anticipated spacer width range to provide enough lateral diffusion of dopants to eliminate weak overlap. Control of spacer width is currently provided by monitoring the thickness of the conformal oxide layer that is deposited or grown over the gate electrode, and by monitoring the anisotropic character of the spacer etch. However, the outcomes of the oxide deposition or growth steps and the subsequent plasma etch are dependent upon a myriad of parameters, and thus do not always yield predictable results. Accordingly, later anneals may not yield the desired amount of lateral diffusion of source/drain dopants, and weak overlap may result.

In addition to weak overlap, conventional spacer processing may yield less than optimal channel transconductance and drive current due to the establishment of a larger than desired channel length. The widths of the spacers, in conjunction with the width of the gate itself, determine the pre-anneal channel length, and thus relate directly to the channel transconductance and the ultimate switching speed of the device. Accordingly, conventional spacer processes are typically designed to yield a spacer with a width that falls within a desired range that corresponds to a desired speed range. If the width of the spacers following plasma etch is larger than anticipated, the ultimate channel length may be larger than desired and result in degraded transconductance, drive current and switching speed.

Subsequent source/drain anneals may be lengthened in an attempt to narrow the channel length. However, lengthening anneals may consume thermal budget and lead to degraded device performance, particularly in processes sensitive to dopant migration, such as those used to fabricate p-channel devices.

The present invention is directed to overcoming or reducing the effects of one or more of the foregoing disadvantages.

SUMMARY OF THE INVENTION

In accordance with one aspect of the present invention, a method of fabricating a circuit device is provided that includes forming a gate on a substrate and forming a first oxide spacer and a second oxide spacer adjacent to the gate. The width of the gate and the first and second oxide spacers is measured. The widths of the first and second oxide spacers are trimmed if the width of the gate and the first and second oxide spacers exceeds a preselected maximum value by exposing the first and second oxide spacers to solution of ammonium hydroxide, hydrogen peroxide and water for a preselected time and rinsing with deionized water.

In accordance with another aspect of the present invention, a method of faceting a circuit device is provided that includes forming a gate on a substrate and forming an oxide layer over the gate. The oxide layer is anisotropically etched to define a first oxide spacer and a second oxide spacer adjacent to the gate. The widths of the gate and the first and second oxide spacers is measured. The widths of the first and second oxide spacers are trimmed if the width of the gate and the first and second oxide spacers exceeds a preselected maximum value by exposing the first and second oxide spacers to a solution of ammonium hydroxide, hydrogen peroxide and water for a preselected time and rinsing with deionized water.

In accordance with another aspect of the present invention, a method of fabricating a circuit device is provided that includes forming a gate on a substrate and forming an oxide layer over the gate. The oxide layer is anisotropically etched to define a first oxide spacer and a second oxide spacer adjacent to the gate. The width of the gate and the first and second oxide spacers is measured. The widths of the first and second oxide spacers are trimmed if the width of the gate and the first and second oxide spacers exceeds a preselected maximum value by exposing the first and second oxide spacers to a solution of ammonium hydroxide, hydrogen peroxide and water for a preselected time and rinsing with deionized water. A third spacer is formed adjacent to the first spacer and a fourth spacer is formed adjacent to the second spacer. The widths of the gate and the first, second, third and fourth oxide spacers is measured. The widths of the third and fourth oxide spacers are trimmed if the width of the gate and the first, second, third and fourth oxide spacers exceeds a preselected maximum value by exposing the third and fourth oxide spacers to solution off ammonium hydroxide, hydrogen peroxide and water for a preselected time and rinsing with deionized water.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
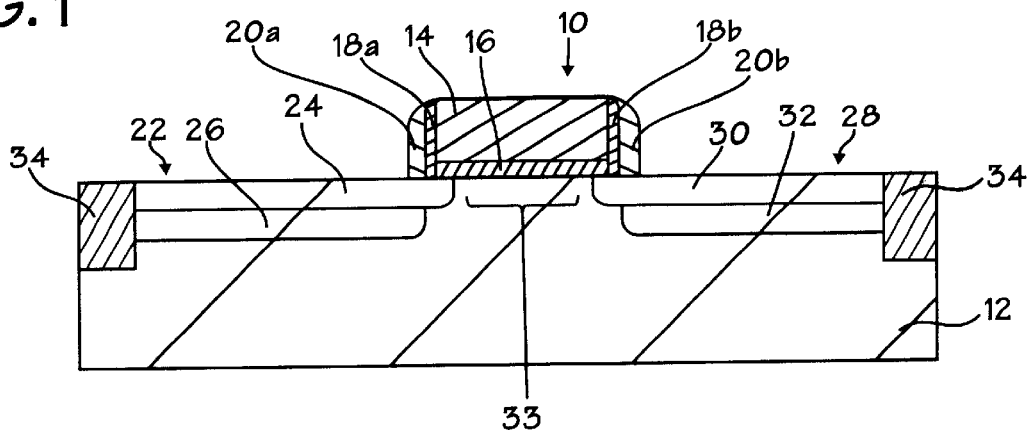
FIG. 1 is a highly magnified cross-sectional view of an exemplary embodiment of a transistor on a semiconductor substrate in accordance with the present invention.

In the drawings described below, reference numerals are generally repeated where identical elements appear in more than one figure. FIG. 1 is a cross-sectional view of an exemplary embodiment of an integrated circuit transistor 10 fabricated on a semiconductor substrate 12. Only a small portion of the substrate 12 is visible and the transistor 10 may be part of a much larger integrated circuit (not shown) implemented on the substrate 12. The transistor 10 includes a gate electrode 14 that is positioned on a gate insulating layer 16, which is, in turn, fabricated on the substrate 12. The gate insulating layer 16 and the gate electrode 14 are bracketed by a first pair of insulating sidewall spacers 18a and 18b and a second pair of insulating sidewall spacers 20a and 20b. A source/drain region 22 consisting of a lightly doped drain ("LDD") 24 and an overlapping heavier doped region 26 is formed in the substrate 12. Another source/drain region 28 similarly consisting of an LDD structure 32 and an overlapping heavier doped region 30 is formed in the substrate 12 and laterally separated from the source/drain region 22. The lateral separation of the source/drain regions 22 and 28 defines a channel region 33. The transistor 10 is physically and electrically isolated laterally from other structures on the substrate 12 by an isolation structure 34, two portions of which are visible in FIG. 1.

Figure 2:
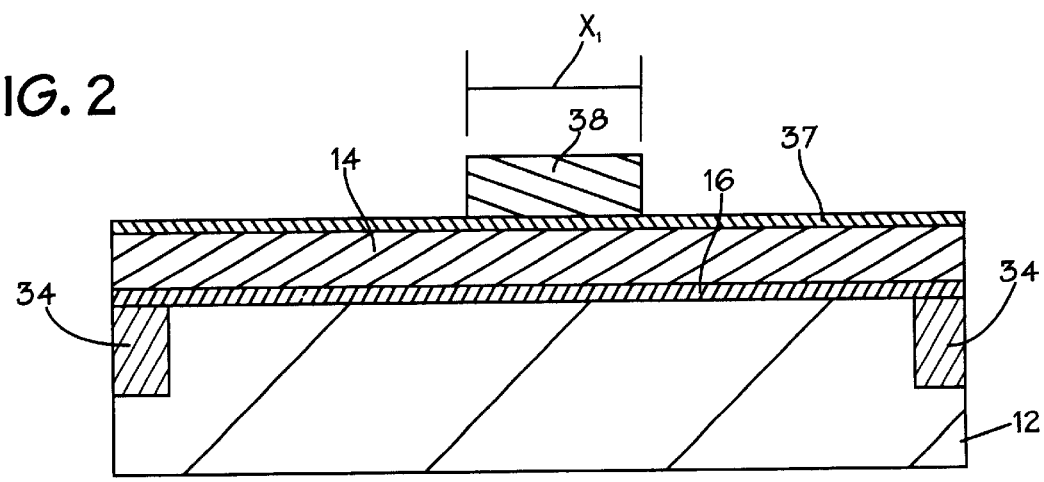
FIG. 2 is a cross-sectional view of the semiconductor substrate of FIG. 1 depicting the formation of a gate insulating layer and a gate electrode layer thereon in accordance with the present invention.

An exemplary process flow for fabricating the transistor 10, and in particular the spacer 18a and 18b and 20a and 20b, in accordance with the present invention may be understood by referring now to FIGS. 2, 3, 4, 5, 6 and 7, and initially to FIG. 2. The fabrication process will be described in the context of a field effect transistor. However, the skilled artisan will appreciate that the techniques described herein may be applied to other circuit devices utilizing insulating spacers. Initially, the substrate 12 is provided with the isolation structure 34. The substrate 12 itself, may be composed of n-doped silicon, p-doped silicon, silicon-on-insulator or other suitable substrate materials. The isolation structure 34 may be a trench isolation structure as shown or a field oxide region as desired and be composed of a variety of insulating materials commonly used for device isolation, such as, for example, oxide, TEOS, or the like.

Next, the gate insulating layer 16 is formed on the substrate 12. As used herein, the terms "formed on", "disposed on" or "positioned on" should be construed to include the possibility that a given layer or structure may be formed on another given layer or structure with a third or other intervening layers or structures disposed between the two. The gate insulating layer 16 may be composed of a variety of materials commonly used for transistor gate dielectrics, such as, for example, silicon dioxide, silicon nitride, silicon oxynitride, $Ta_2O_5$ or the like. In an exemplary embodiment, the gate insulating layer 16 is composed of silicon dioxide and may be fabricated by thermal oxidation of the substrate 12 or by CVD. As used herein, the phrase 'composed of' is not intended to exclude the incorporation of other constituents in a given layer. In an exemplary embodiment, the substrate 12 is subjected to a oxygen containing ambient at about 800 to 1000° C. for about 10 to 60 seconds in a rapid thermal anneal ("RTA") process or a furnace process for about 10 to 30 minutes. The thus-formed layer gate dielectric layer 12 may have a thickness of about 10 to 80 Å.

Next, the gate electrode layer 14 is formed on the gate insulating layer 16. A variety of conducting materials may be used for the gate electrode layer 14, such as, for example, polysilicon, amorphous silicon, aluminum, copper or other well-known conducting materials. In an exemplary embodiment in accordance with the present invention, the layer 14 is composed of polysilicon. An antireflective coating layer 31 is formed on the polysilicon layer to facilitate subsequent lithographic patterning. The antireflective coating 37 may be composed of silicon nitride, silicon oxynitride or other well-known antireflective coating materials and may have a thickness of about 200 to 800 Å. A photomask 38 is subsequently formed and patterned on the antireflective coating layer 37. The mask 38 is patterned with a lateral dimension $X_1$, which advantageously corresponds to the critical dimension ("CD") for the subsequent patterning of the gate electrode 14.

Figure 3:
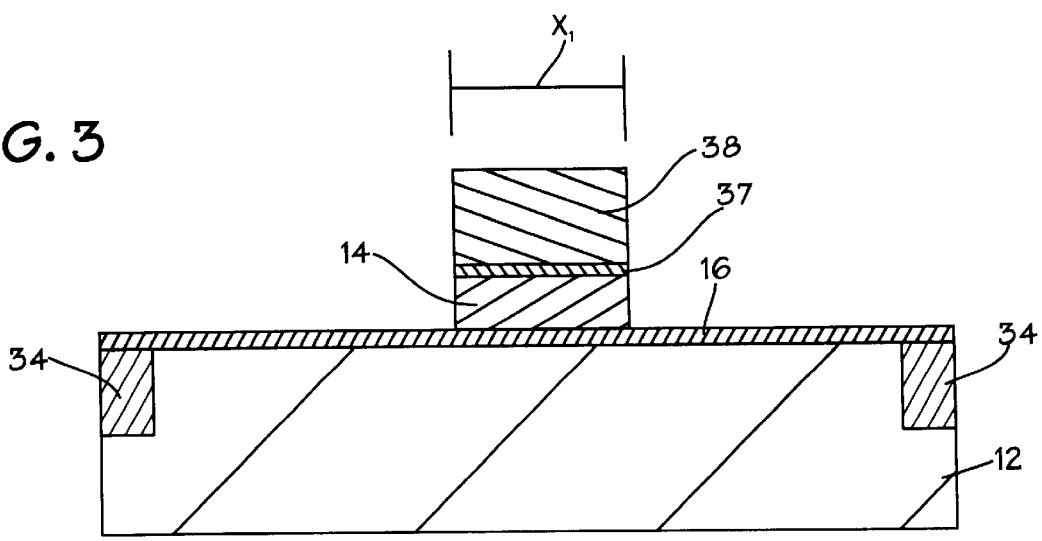
FIG. 3 is a cross-sectional view like FIG. 2 depicting an anisotropic etch of the gate electrode layer to define a gate electrode in accordance with the present invention.

The patterning of the gate electode layer 14 may be understood by referring now to FIG. 3. The antireflective coating 37 and the polysilicon gate electode layer 14 are anisotropically etched to yield the gate 14 with a lateral dimension that is approximately equal to the width $X_1$ of the photomask 38. The anisotropic etch may be by chemical plasma etching, reactive ion etching or like anisotropic etching techniques and may use a variety of etch chemistries suitable for anisotropic etching polysilicon selective to the underlying gate insulating layer 16. For example, a mixture of HBr, $Cl_2$ and He may be used to etch selectively to oxide. The anisotropic etch of the polysilicon 14 may consist of a main etch and overetch or trim if desired. End point detection for the main etch may be by emission spectroscopy and end point detection for an overetch, if performed, may be timed. If the antireflective coating 37 is composed of a material that is not readily etchable by the etch chemistry utilized for the polysilicon layer 14, a different chemistry may be initially used that will attack the material. For example, if the layer 37 is composed of silicon oxynitride, a $CF_4/O_2$ etch may precede the main etch of the polysilicon 14.

Figure 4:
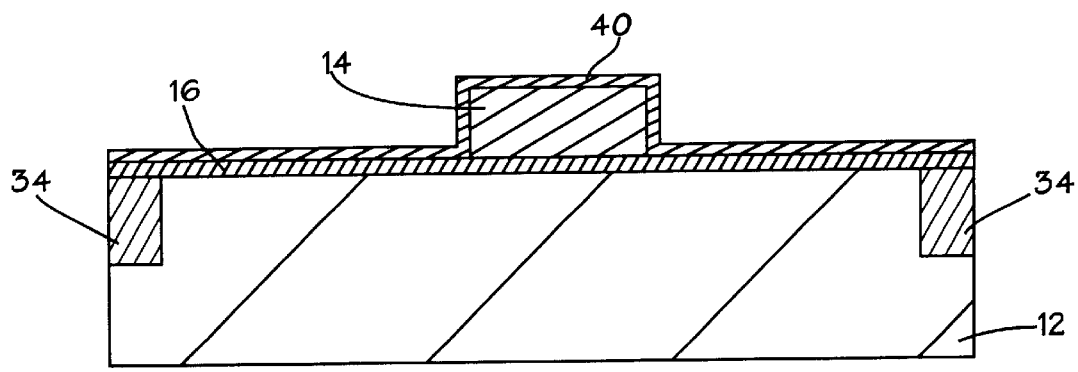
FIG. 4 is a cross-sectional view like FIG. 3 depicting formation of a conformal insulating layer in accordance with the present invention.
Figure 5:
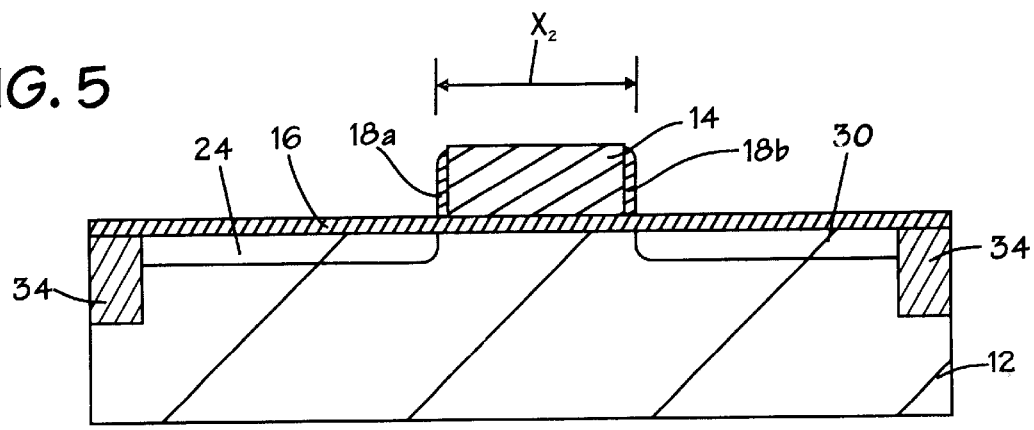
FIG. 5 is a cross-sectional view like FIG. 4 depicting etching of the insulating layer to define of a first set of sidewall spacers in accordance with the present invention.

The fabrication of the first pair of spacers 18a and 18b may be understood by referring now also to FIGS. 4 and 5. Initially, the photomask 38 is stripped by ashing, well-known chemical stripping techniques or a combination of the two. At this point, the width of the gate electrode 14 is measured by well-known width measurement techniques to determine if it falls within a preselected gate width distribution for the fabrication process. The preselected gate width distribution is used to set the acceptable device speed distribution for a given fabrication process and is largely a matter of design discretion. If the lateral dimension of the gate electrode 14 does fall within the preselected gate width distribution, then processing proceeds to a wafer preclean in anticipation of the fabrication of the pair of spacers 18a and 18b. If, however, the lateral dimension of the gate electrode 14 is larger than the preselected or desirable distribution of gate widths for the integrated circuit, an anisotropic plasma etch or trim may be performed or an isotropic wet etch trim in accordance with the present invention may be performed at this point to reduce the lateral dimension of the gate electrode 14 and bring it within the desired range. The wet etch of the gate electrode 14 may be performed by exposing the gate electrode 14 to an aqueous solution of ammonium hydroxide for a preselected duration. The exposure may be by immersion in a bath, by spray on or other techniques. The concentration of anunonium hydroxide may range from about 15 to 1 to about 8 to 1, where the ratios represent parts water to parts ammonium hydroxide. The temperature of the etch solution may be about 20 to 70° C. In an illustrated embodiment, an 8 to 1 aqueous $NH_4OH$ solution yields an etch rate of about 35 Å/minute for undoped polysilicon.

Still referring to FIG. 4, a preclean process is perfomed to remove any residual resist or other impurities from the gate electrode 14. Well-known cleansing methods may be used, such as, an aqueous sulphuric acid-peroxide mixture ("SPM") followed by an aqueous ammonium hydroxide and peroxide mixture ("APM"), and finally an aqueous hydrochloric acid-peroxide mixture ("HPM"). Next, a thin conformal oxide film 40 is formed on and around the gate electrode 14. Through subsequent processing, the film 40 will be patterned to define the first pair of spacers 18a and 18b shown in FIG. 1. The oxide film 40 may be formed by thermal oxidation, CVD or the like. The film 40 may be oxide or TEOS with or without densification. The deposition or oxidation process is controlled so that the film 40 is formed with a thickness that will yield a desired thickness for the first pair of spacers 18a and 18b following etching. In an exemplary embodiment, the film 40 may be deposited or grown to a thickness of about 50 to 200 Å.

Referring now to FIG. 5, the film 40 depicted in FIG. 4 is anisotropically etched to yield the first pair of insulating spacers 18a and 18b. The anisotropic etch may be by chemical plasma etching, reactive ion etching or other like anisotropic etching techniques and may use a variety of etch chemistries suitable to anisotropically etch the oxide film 40. In an exemplary embodiment, $CF_4/H_2$ is used to anisotropically etch and define the spacers 18a and 18b. Endpoint detection may be by the techniques disclosed above for the etch definition of the gate 14.

Subsequent to the etch definition of the first pair of spacers 18a and 18b, the lateral kept dimension $X_2$ of the combined gate electrode 14 and the spacers 18a and 18b is measured using well-known width measurement techniques and compared to a preselected width distribution for the combination of the gate electrode 14 and the spacers 18a and 18b for the integrated circuit.

| ETCH SOLUTION | SPACER MATERIAL | TEMPERATURE | ETCH RATE |
|---|---|---|---|
| One (1) part $NH_4OH$: four (4) parts $H_2O_2$; twenty (20) parts $H_2O$ (by volume) | CVD Oxide Undensified | 50° C. | 2.8 Å/minute |
| | | 60° C. | 4.6 Å/minute |
| | | 70° C. | 8.5 Å/minute |
| | Thermal Oxide | 50° C. | 0.5 Å/minute |
| | | 60° C. | 0.7 Å/minute |
| | | 70° C. | 1.6 Å/minute |
| | TEOS | 50° C. | 0.7 Å/minute |
| | | 60° C. | 0.9 Å/minute |
| | | 70° C. | 2.2 Å/minute |
| 1 part $NH_4OH$: 1 part $H_2O_2$; 5 parts $H_2O$ (by volume) | CVD Oxide Undensified | 60° C. | 6.2 Å/minute |
| | Thermal Oxide | 60° C. | 1.1 Å/minute |
| | TEOS | 60° C. | 1.4 Å/minute |

To illustrate the process, it assumed that the first pair of spacers 18a and 18b consist of CVD undensified oxide and the measured value of $X_2$ is about 50 Å larger than the maximum width value in the preselected width distribution. To reduce the value of $X_2$ by 50 Å, the spacers 18a and 18b may each be trimmed by 25 Å by etching with a 1:4:20 solution of $NH_4OH$, $H_2O_2$ and $H_2O$ at about 60° C. for about five minutes.

The etch may be by bath or spray. If a bath is used, it is desirable to circulate the etch solution to facilitate both etch rate and etch uniformity. The optimal flow rate for a given etch is highly dependent upon parameters, such as the geometry of the bath, and the flow characteristics of the recirculation plumbing and pumping apparatus, to name a few. In an illustrated embodiment for a 1:4:20 solution of $NH_4OH$, $H_2O_2$ and $H_2O$ at about 60° C., a flow rate of about 2.0 liters/minute is appropriate.

Irrespective of the particular etch solution utilized, a subsequent rinse in deionized water is performed and a drying step utilizing isopropyl alcohol vapor or a spin dry in hot nitrogen gas is used to complete the wet etch cycle. The rinse may be by immersion in a neutral bath of deionized water or by deionized water spray, and may be carried out at room temperature. The aforementioned chemical SPM, APM and HPM cleansing processes may be performed in anticipation of the fabrication of the spacers 20a and 20b (see FIG. 1). If desired, the SPM and HPM cleansing processes may be performed sequentially with the aforementioned $NH_4OH$, $H_2O_2$ and $H_2O$ etch process.

Following the full definition of the spacers 18a and 18b, the LDD structures 24 and 32 may be established in the substrate 12 by ion implantation self-aligned to the spacers 18a and 18b. If desired, the source/drain regions 22 and 28 depicted in FIG. 1 may be single graded, and thus, the implant may be tailored so that the LDD structures 24 and 32 actually comprise the entire source/drain regions.

Figure 6:
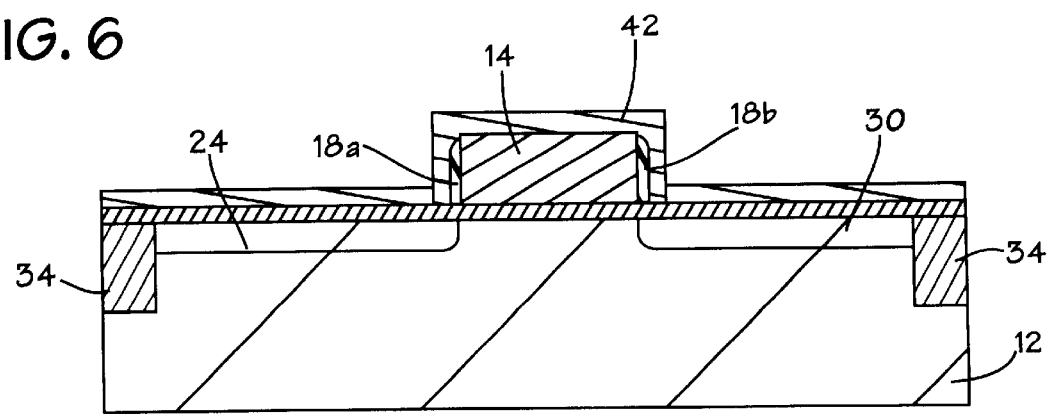
FIG. 6 is a cross-sectional view like FIG. 5 depicting formation of a conformal insulating layer in accordance with the present invention.
Figure 7:
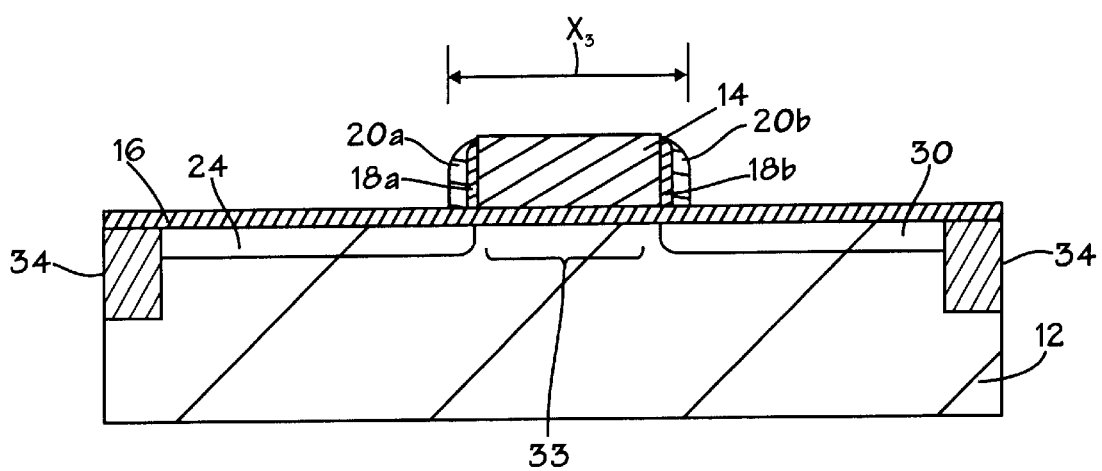
FIG. 7 is a cross-sectional view like FIG. 6 depicting etching of the insulating layer to define of a second set of sidewall spacers in accordance with the present invention.

The fabrication of the spacers 20a and 20b may be understood by referring now to FIGS. 6 and 7. As shown in FIG. 6, a conformal film 42 of insulating material is fabricated over the gate electrode 14 and the first spacers 18a and 18b. The insulating film 42 may be composed of the same materials and formed using the same techniques described above for the first spacers 18a and 18b. Referring now to FIG. 7, the film 42 is anisotropically etched to yield the defined spacers 20a and 20b. The etch may be performed using the aforementioned parameters and chemistries specified for the anisotropic etch of the first spacers 18a and 18b. Subsequent to the anisotropic spacer etch, the lateral dimension $X_3$ of the combination of the gate electrode 14, the spacers 18a and 18b and the spacers 20a and 20b is determined using well know width measurement techniques and compared with the preselected width distribution for this combined structure. As with the foregoing etch process to initially define the spacers 18a and 18b, if the dimension $X_3$ falls within the preselected width distribution for this phase of processing, the processing of the substrate 12 may proceed further. If, however, the dimension $X_3$ is larger than the maximum value in the preselected width distribution, the spacers 20a and 20b may be subjected to the aforementioned wet $NH_4OH$, $H_2O_2$ and $H_2O$ etch process. Again, this wet etch trim of the spacers 20a and 20b may be performed in conjunction with the aforementioned SPM and HPM cleansing processes if desired.

The isotropic character of the wet etch produces a pronounced rounding at the upper corners of the spacers 18a, 18b, 20a and 20b. This enhanced rounded profile improves step height, resulting in more favorable planarity of subsequently deposited films.

Following definition of the spacers 20a and 20b, the overlapping heavier doped regions 26 and 32 depicted in FIG. 1 may be established in the substrate 12 by ion implantation. A subsequent anneal may be performed to activate the source/drain regions 22 and 28 and to repair any crystalline damage caused by the implants. The anneal will produce the lateral encroachment of the LDD structures 24 and 32 and the overlapping regions, 26 and 30 beneath the gate electrode and the spacers 20a and 20b.

The skilled artisan will appreciate that the present invention enables spacer fabrication with fine tuning of lateral gate-plus-spacer dimension. If the gate-plus-spacer lateral dimension exceeds specifications, the process of the present invention may be employed to trim the spacers and bring the gate-plus-spacer lateral dimension back within specifications. The potential for weak overlap and undesirably long channels lengths is significantly reduced without the need for longer or higher temperature anneals.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device, comprising:
    forming a gate on a substrate;
    forming a first oxide spacer and a second oxide spacer adjacent to the gate;
    measuring the width of the gate and the first and second oxide spacers; and
    trimming the widths of the first and second oxide spacers if the width of the gate and the first and second oxide spacers exceeds a preselected maximum value by exposing the first and second oxide spacers to a solution of ammonium hydroxide, hydrogen peroxide and water for a preselected time.

2. The method of claim 1, wherein the solution of ammonium hydroxide, hydrogen peroxide and water comprises about 1 part ammonium hydroxide, 4 parts hydrogen peroxide and 20 parts water by volume.

3. The method of claim 1, wherein the solution of ammonium hydroxide, hydrogen peroxide and water comprises about 1 part ammonium hydroxide, 1 part hydrogen peroxide and 5 parts water by volume.

4. The method of claim 1, wherein the temperature of the etch solution is about 50 to 70° C.

5. The method of claim 1, wherein the first and second oxide spacers are formed by fabricating a conformal oxide layer over the gate and anisotropically etching the oxide layer.

6. The method of claim 1, wherein the first and second oxide spacers co mprise CVD oxide, thermal oxide or TEOS.

7. The method of claim 1, wherein the trimming of the widths of the first and second oxide spacers comprises rinsing with deionized water.

8. A method of fabricating a circuit device, comprising:
    forming a gate on a substrate;
    forming an oxide layer over the gate;
    anisotropically etching the oxide layer to define a first oxide spacer and a second oxide spacer adjacent to the gate;
    measuring the width of the gate and the first and second oxide spacers; and
    trimming the widths of the first and second oxide spacers if the width of the gate and the first and second oxide spacers exceeds a preselected maximum value by exposing the first and second oxide spacers to a solution of ammonium hydroxide, hydrogen peroxide and water for a preselected time.

9. The method of claim 8, wherein the solution of ammonium hydroxide, hydrogen peroxide and water comprises about 1 part ammonium hydroxide, 1 part hydrogen peroxide and 5 parts water by volume.

10. The method of claim 8, wherein the temperature of the etch solution is about 50 to 70° C.

11. The method of claim 8, wherein the oxide layer comprises CVD oxide, thermal oxide or TEOS.

12. The method of claim 8, comprising forming a third spacer adjacent to the first spacer and a fourth spacer adjacent to the second spacer, measuring the width of the gate and the first, second, third and fourth oxide spacers, and trimming the widths of the third and fourth oxide spacers if the width of the gate and the first, second, third and fourth oxide spacers exceeds a preselected maximum value by exposing the third and fourth oxide spacers to solution of ammonium hydroxide, hydrogen peroxide and water for a preselected time and rinsing with deionized water.

13. The method of claim 8, wherein the solution of ammonium hydroxide, hydrogen peroxide and water comprises about 1 part ammonium hydroxide, 4 parts hydrogen peroxide and 20 parts water by volume.

14. The method of claim 8, wherein the trimming of the widths of the first and second oxide spacers comprises rinsing with deionized water.

15. A method of fabricating a circuit device, comprising:

forming a gate on a substrate;

forming an oxide layer over the gate;

anisotropically etching the oxide layer to define a first oxide spacer and a second oxide spacer adjacent to the gate;

measuring the width of the gate and the first and second oxide spacers;

trimming the widths of the first and second oxide spacers if the width of the gate and the first and second oxide spacers exceeds a preselected maximum value by exposing the first and second oxide spacers to a solution of ammonium hydroxide, hydrogen peroxide and water for a preselected time and rinsing with deionized water;

forming a third spacer adjacent to the first spacer and a fourth spacer adjacent to the second spacer;

measuring the width of the gate and the first, second, third and fourth oxide spacers; and trimming the widths of the third and fourth oxide spacers if the width of the gate and the first, second, third and fourth oxide spacers exceeds a preselected maximum value by exposing the third and fourth oxide spacers to a solution of ammonium hydroxide, hydrogen peroxide and water for a preselected time and rinsing with deionized water.

16. The method of claim 15, wherein the temperature of the etch solution is about 50 to 70° C.

17. The method of claim 15, wherein the oxide layer comprises CVD oxide, thermal oxide or TEOS.

18. The method of claim 15, wherein the solution of ammonium hydroxide, hydrogen peroxide and water comprises about 1 part ammonium hydroxide, 4 parts hydrogen peroxide and 20 parts water by volume.

19. The method of claim 15, wherein the solution of ammonium hydroxide, hydrogen peroxide and water comprises about 1 part ammonium hydroxide, 1 part hydrogen peroxide and 5 parts water by volume.

* * * * *

UNITED STATES PATENT AND TRADEMARK OFFICE
CERTIFICATE OF CORRECTION

PATENT NO.    : 6,492,275 B2
DATED         : December 10, 2002
INVENTOR(S)   : Deborah J. Riley et al.

It is certified that error appears in the above-identified patent and that said Letters Patent is hereby corrected as shown below:

<u>Column 6,</u>
Line 34, insert

--The preselected width distribution for the combination of the gate electrode 14 and the first pair of spacers 18a and 18b is selected to ensure that the spacers 18a and 18b have widths that will provide sufficient protection for the edges of the gate electrode 14 and the gate insulating layer 16, and the substrate 12 at the edges of the gate 14 from excessive implant damage. If the dimension $X_2$ falls within the preselected width distribution for the integrated circuit, processing may proceed directly to fabrication of the second pair of spacers 20a and 20b (see FIG. 1). If, however, the dimension $X_2$ is larger than the preselected width distribution, the spacers 18a and 18b may be subjected to an isotropic wet etch using an ammonium hydroxide, hydrogen peroxide and deionized water solution. Experiment has established known etch rates for undensified CVD oxide, thermal oxide and TEOS for various $NH_4OH$, $H_2O_2$ and $H_2O$ and water etch solutions and at various temperatures. These etch rates for a bath process are summarized in the table set forth below.--

Signed and Sealed this

Fifth Day of August, 2003

JAMES E. ROGAN
*Director of the United States Patent and Trademark Office*